(12) United States Patent
Lengefeld et al.

(10) Patent No.: US 10,782,749 B2
(45) Date of Patent: Sep. 22, 2020

(54) COMPUTE ASSEMBLY FOR HIGH SPEED ULTRA DENSE COMPUTE BLADES

(71) Applicant: Cray Inc., Seattle, WA (US)

(72) Inventors: Wendell Lengefeld, Chippewa Falls, WI (US); Abhishek Mehta, Chippewa Falls, WI (US); William Mark Megarity, Chippewa Falls, WI (US); Mark E. Steinke, Chippewa Falls, WI (US); Benjamin Colin Heshmat, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/156,732

(22) Filed: Oct. 10, 2018

(65) Prior Publication Data

US 2020/0117250 A1   Apr. 16, 2020

(51) Int. Cl.
| | |
|---|---|
| H05K 7/20 | (2006.01) |
| H05K 7/14 | (2006.01) |
| G06F 1/20 | (2006.01) |
| G06F 1/18 | (2006.01) |

(52) U.S. Cl.
CPC .............. G06F 1/20 (2013.01); G06F 1/181 (2013.01); H05K 7/1487 (2013.01); H05K 7/20709 (2013.01); *G06F 2200/201* (2013.01)

(58) Field of Classification Search
CPC ............ G06F 13/00; G06F 1/181; G06F 1/20; H05K 1/0272; H05K 1/18
See application file for complete search history.

(56) References Cited

U.S. PATENT DOCUMENTS

| | | | | |
|---|---|---|---|---|
| 5,343,359 | A * | 8/1994 | Morton | H05K 1/141 174/252 |
| 6,500,010 | B2 * | 12/2002 | Yatskov | H01R 12/62 439/493 |
| 6,714,647 | B1 | 3/2004 | Cowan et al. | |
| 6,822,867 | B2 | 11/2004 | Hsieh | |
| 7,120,027 | B2 * | 10/2006 | Yatskov | H01L 23/4006 361/716 |
| 7,149,086 | B2 * | 12/2006 | Faneuf | H01L 23/427 361/699 |
| 7,417,861 | B2 * | 8/2008 | Kikuchi | H01L 25/162 361/718 |
| 7,499,278 | B2 | 3/2009 | Sauciuc et al. | |
| 7,773,378 | B2 * | 8/2010 | Lin | H05K 7/20409 361/690 |
| 8,069,293 | B1 * | 11/2011 | Rogan | G06F 13/385 370/248 |
| 8,982,563 | B2 * | 3/2015 | Raj | H05K 7/1092 361/694 |

(Continued)

*Primary Examiner* — Jayprakash N Gandhi
*Assistant Examiner* — Michael A Matey (57) ABSTRACT

A circuit assembly is provided which makes efficient us of space provided on a main board having a CPU and a supporting board which is designed to have a network interface chip (NIC). The circuit assembly further has a cooling plate situated between the two boards, which is optimized to provide efficient cooling operations. The circuit assembly is part of a blade, which includes a housing to contain and support all necessary components. The space within the blade housing is efficiently used, so that processing, communication and cooling operations are all optimized.

23 Claims, 7 Drawing Sheets

(56) References Cited

U.S. PATENT DOCUMENTS

| | | | |
|---|---|---|---|
| 9,084,370 B2 | 7/2015 | Bellin et al. | |
| 9,253,920 B2 | 2/2016 | Rossi et al. | |
| 9,261,924 B2* | 2/2016 | Grunow | H01L 23/34 |
| 9,310,859 B2 | 4/2016 | Barina et al. | |
| 9,342,118 B2 | 5/2016 | Barina et al. | |
| 9,647,882 B1 | 5/2017 | Whittaker | |
| 9,823,718 B2* | 11/2017 | Platt | G06F 1/203 |
| 2002/0008963 A1* | 1/2002 | DiBene, II | G06F 1/18 |
| | | | 361/720 |
| 2002/0030974 A1* | 3/2002 | Higashida | H05K 1/14 |
| | | | 361/748 |
| 2004/0218361 A1* | 11/2004 | Lin | H05K 1/144 |
| | | | 361/695 |
| 2008/0101011 A1* | 5/2008 | Carr | G06F 1/185 |
| | | | 361/679.31 |
| 2008/0123312 A1* | 5/2008 | Cheng | H02M 3/00 |
| | | | 361/790 |
| 2013/0050971 A1* | 2/2013 | Sakita | H05K 3/368 |
| | | | 361/803 |
| 2013/0128464 A1* | 5/2013 | Chen | H05K 7/026 |
| | | | 361/721 |
| 2013/0286602 A1* | 10/2013 | Chang | H05K 7/026 |
| | | | 361/736 |
| 2016/0120019 A1 | 4/2016 | Shedd et al. | |
| 2016/0170928 A1* | 6/2016 | Tamarkin | G06F 13/409 |
| | | | 710/313 |
| 2017/0147044 A1 | 5/2017 | Slaton et al. | |
| 2017/0150643 A1* | 5/2017 | Sporer | G06F 1/20 |
| 2017/0262029 A1* | 9/2017 | Nelson | G06F 1/20 |
| 2018/0165244 A1* | 6/2018 | Jimenez | G06F 13/4022 |
| 2018/0376611 A1* | 12/2018 | Madanipour | G06F 1/184 |
| 2019/0191542 A1* | 6/2019 | Iwamoto | H05K 1/0204 |

* cited by examiner

COMPUTE ASSEMBLY FOR HIGH SPEED ULTRA DENSE COMPUTE BLADES

BACKGROUND

High performance computing systems (or highly capable computing systems) have many unique needs, concerns and demands including power issues, component cooling, and the efficient use of physical space. These systems typically include multiple processors working in conjunction with one another, thus requiring significant communication interfaces and large memory needs. Additionally, all of the components or systems require physical space, power supplies, and cooling structures. The efficient operation and use of these systems can be challenging, especially when the actual systems are custom designed, and the facilities vary considerably. Further, there are often needs to modify the scale of a particular system to increase capacity. As such, a flexible and adaptable approach is beneficial.

As mentioned, high performance computing systems require certain levels of computing power to meet computing needs. When looking at system configurations and custom installations however, there are many additional details which must also be addressed. These details can often include: (1) physical structures needed to house the necessary electronic components; (2) housings and interconnects for communication components; (3) appropriate cooling accommodations; and (4) overall system controls to provide coordinated operation of the various components.

In addition to the particular needs of computing installations, it is obviously desirable from a manufacturing standpoint to have common components and interchangeable structures, thus typically minimizing manufacturing costs and expenses. In addition, system expandability must be considered so that the system is able to deal with continuous changes in computing needs. As such, structures, components and devices which are adaptable, expandable and reusable are very beneficial. For example, a physical rack system which can accommodate removable computing components, communication components, and other electronic components is a beneficial and highly desirable physical structure to use when designing a high speed computing system. Further, a rack system which accommodates virtually any physical layout is also extremely helpful. As an example, one beneficial system may include a rack system with cooling infrastructure supplied in many different ways, such as equipment which provides appropriate air/liquid from above, below, or the side of a specific cabinet itself. These systems will then internally route cooling air/liquid to specific locations. Systems which can accommodate any and all of these various configurations are thus helpful, desirable and extremely efficient.

As is well known, high speed computing systems utilize multiple processors in communication with one another to carry out various tasks. In many installations, these processors are supported on appropriate circuit boards, which also provide related components, such as power supplies, memory, etc. In some cases, these circuit boards, or processor boards, may contain multiple processors, which again, are configured to operate in a coordinated manner.

In order to provide convenience, repairability, and overall consistency, processor boards and related equipment are often contained in physical structures referred to as compute blades. These blades can be easily installed in a chassis, and are often easily removable and replaceable. Further, each blade typically includes an enclosure containing multiple components which also has connectors and couplers to achieve the necessary electrical, thermal and physical connections. In one example, each blade housing will include a networking interface connection, a cooling system connection and appropriate physical latching mechanisms, all configured to interact with related components within the chassis. As is also well recognized the blade enclosure provides a confined space to contain all required components. That said, this space also provides physical limitations regarding what type of components can be included and how they must be configured. The efficient use of this space is highly beneficial.

As suggested above, printed circuit boards (PCBs) are specifically suited to support electronic components, and to facilitate the communication of electrical signals. As PCBs have evolved, the complexity of the electronic components, and the complexity of the signal transmission structures on the PCB have evolved considerably. Modern day circuit boards are typically multi-layer structures, with communication paths extending between hundreds of different components. As such, the board layout and interaction of all structures can potentially effect overall operation and efficiency.

In order to maximize space and efficiency of operation, it is desirable to specifically manage the use of space on printed circuit board. In many cases, it is also desirable to incorporate multiple boards and related electrical components (i.e. printed circuit board assemblies (PCBAs)), which are in communication with one another to further achieve efficiency. That said, the use of multiple co-functioning PCBAs creates interface and communication issues, especially when dealing with high-speed communication signals.

As mentioned above, high-speed signal transmission is necessary for high performance computing systems to carry out their tasks, typically involving signals within a frequency range of 3 to 56 gigabits per second (Gbps), or even higher. Operating at this speed often creates several complications, and creates a need to closely examine signal losses throughout the PCB and any related connectors or communication paths. Circuit board structures typically display a relatively high level of electrical loss as high-speed data signals traverse the PCB. This is a significant concern when signals are required to travel significant distances. Typically, these signals are communicated through a confining transmission line structure which propagates the signal's electromagnetic energy. Transmission lines in general must confine this signal energy and allow it to propagate relatively unimpeded, without incurring too much electrical loss, either in the form of skin-effect metal resistive loss or as dielectric loss in the surrounding material. In addition, connectors create addition sources of loss when dealing with high speed signals. Thus it is desirable to minimize the distance signals travel, and the number of connectors used in any particular system.

Again, high-speed connections (i.e. high speed communication paths) are subject to multiple detrimental effects, such as signal loss (also referred to as signal attenuation), signal deterioration and unwanted reflections, all caused by the inherent characteristics of known substrate structures. As such, careful consideration of these effects is also required when designing boards and related systems.

As is well recognized, processors and related electronic equipment used in high-performance computing systems often generate undesirable levels of heat. In many cases, liquid cooling systems are utilized to deal with this, which manage the flow of cooling liquid through cold plates or other mechanisms specifically designed to draw heat away from the related electrical components. Given the above-mentioned size constraints of compute blades, it is particularly challenging to design appropriate and effective cooling mechanisms, since they typically have considerable size/mass requirements.

SUMMARY

In order to address the challenges outlined above, the various embodiments of a compute assembly are presented, which make efficient use of space within the compute blade, while also providing capabilities necessary for high speed computing operations. As one particular feature, at least one network interface card (NIC) is incorporated into each compute blade. In order to efficiently utilize space, and provide efficient operation, the NIC is positioned in very close proximity to a related processor, thus allowing for short signal transmission distances, and the efficient use of cooling systems. In this particular embodiment, a single cold plate is utilized to provide cooling to both a CPU or processor, and the NIC itself. Other supporting structures, potentially including physical connectors, backer plate, alignment rods and guide posts are utilized to ensure efficient operation.

BRIEF DESCRIPTION OF THE DRAWINGS

Further advantages of the various embodiments will be apparent from reading the following detailed description, in conjunction with the drawings in which.

DESCRIPTION

As suggested above, a coordinated circuit assembly is provided which accommodates high speed processor operation, and maximizes the use of space within compute blades. As will be further detailed below, the compute assembly or circuit assembly includes the main processor board which is configured to support at least one processor, along with all supporting electronics and systems (i.e., memory, power, communication, etc.). Further, the compute assembly includes a network interface board or a network interface card (NIC), which is specifically configured to provide a high speed communication interface to other systems and/or other processors. In order to allow efficient operation, a cold plate is incorporated or included in the compute assembly, to deal with cooling of both the processor and the network interface card. In various preferred embodiments, this cooling plate is positioned between the PCBA supporting the processor and the PBCA supporting the network interface components, so that opposite surfaces of the cooling plate can be in contact with relevant components. In order to provide effective communication, the network interface card and the processor board assembly are electrically coupled to one another utilizing at least one riser card, configured to transmit signals between the related boards. In addition to the components referenced above, various alignment and mounting structure are incorporated to ensure desired positioning, maintain appropriate relationships between components, and securely couple components to one another. As discussed in additional detail below, the physical alignment and placement of components insures that cooling operations are carried out in an efficient and effective manner.

Figure 1:
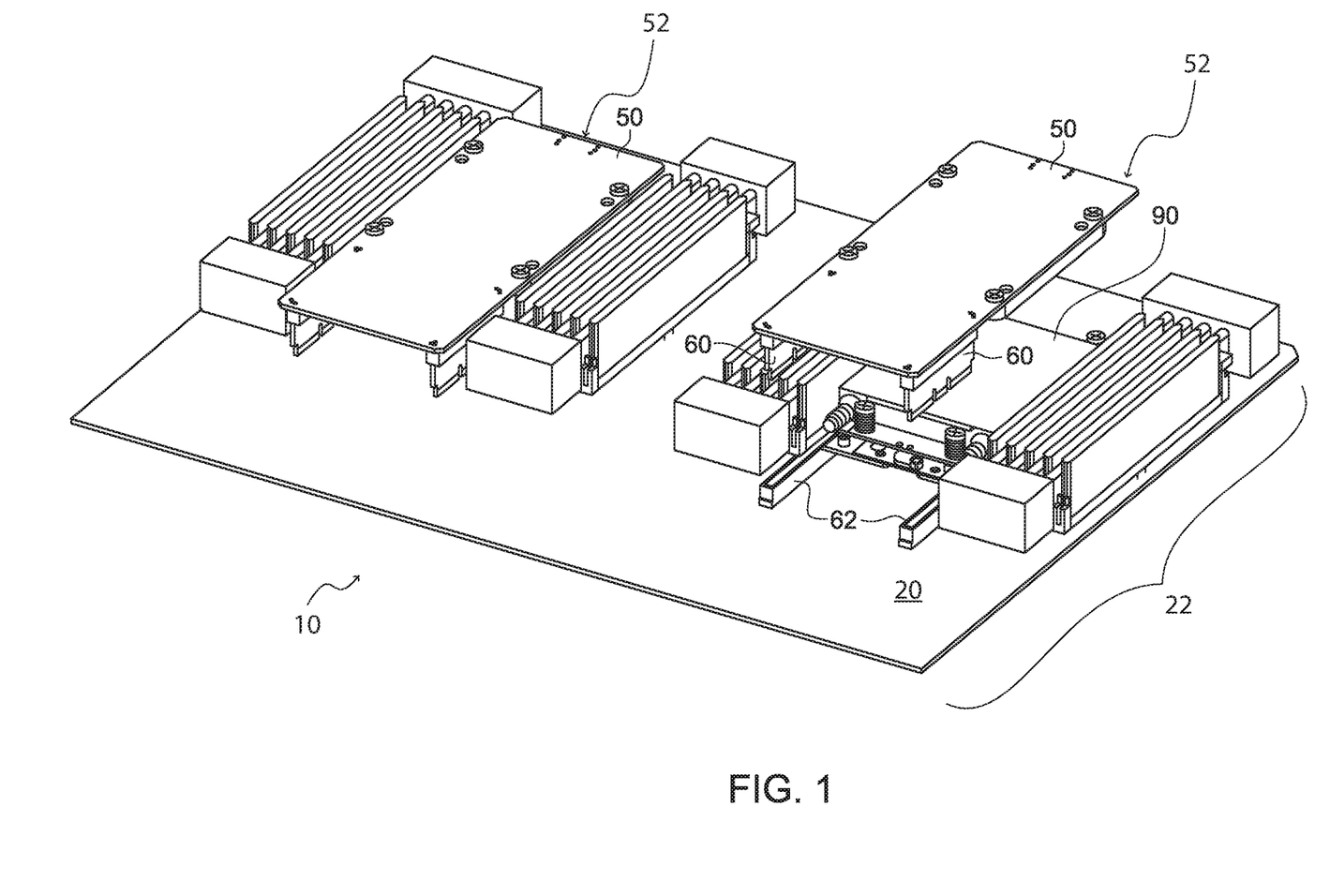
FIG. 1 is a perspective view of a circuit assembly.

Turning now to FIG. 1, a perspective view of a circuit assembly 10 is generally illustrated. As shown, circuit assembly 10 includes a printed circuit board 20 which is designed and configured to support multiple components thus forming a printed circuit board assembly (PCBA) 22. In this embodiment, printed circuit board 20 supports two processors 30 along with related memory modules, power circuits, platform controller hub circuitry, and hardware supervisory systems etc. (not shown). As will be appreciated, the inclusion of these multiple components requires significant amounts of board space, thus requiring additional components to be placed elsewhere. Most significantly, the incorporation of a dedicated network interface card controller (NIC) becomes challenging. To address this need, circuit assembly 10 incorporates a network interface controller board 50 as a supplemental component. As best illustrated in FIG. 1, network interface board 50 is electrically coupled to print circuit board 20 using a pair of riser cards 60. These riser cards can be removably coupled using connector socket 62. Although not typically contemplated, network interface controller board 50 can thus be easily replaced or removed as needed.

As previously mentioned, printed circuit board 20 supports at least one CPU (not specifically shown in FIG. 1). As is well recognized in high speed computing operations, a CPU typically generates significant levels of heat, thus cooling mechanisms are typically incorporated. As generally illustrated in FIG. 1, a cooling plate or cold plate 90 is positioned upon CPU and configured to cover or substantially enclose the CPU. It will be generally appreciated that each CPU will have a corresponding cold plate 90, thus providing cooling features for each processor.

Figure 2:
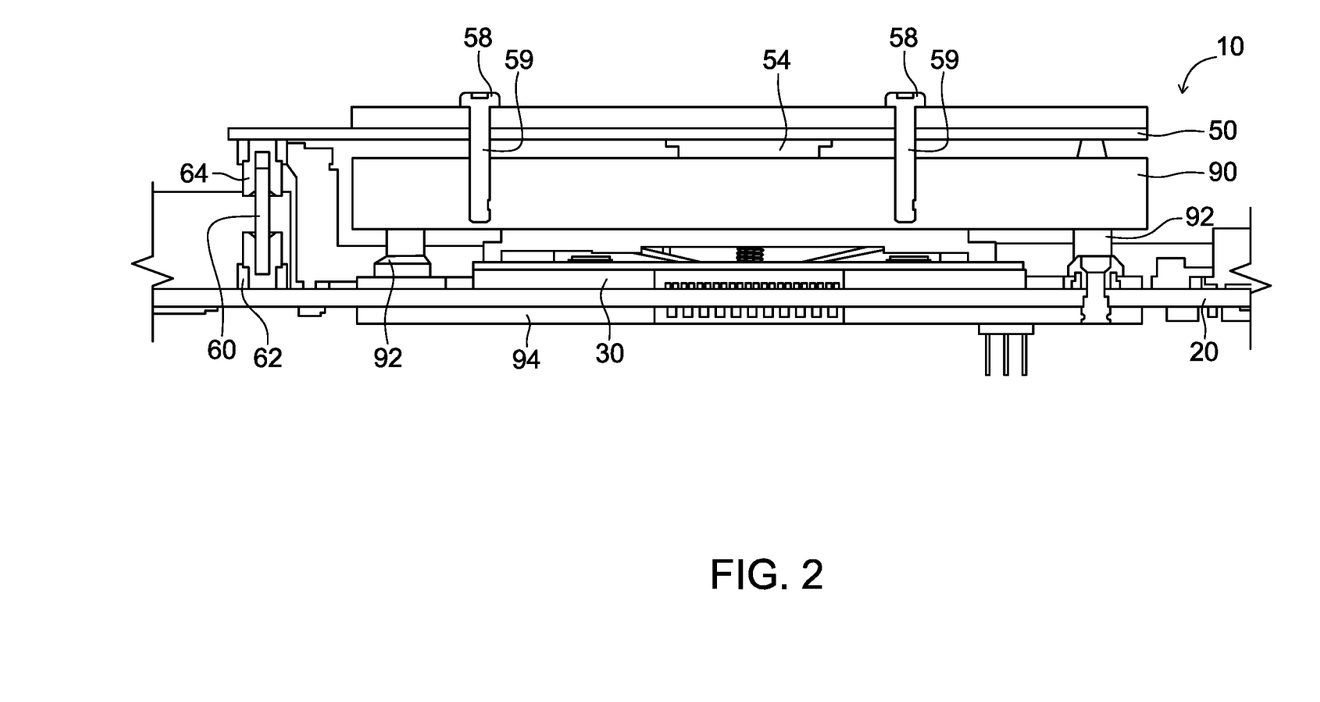
FIG. 2 is a cross-sectional view of one embodiment of the circuit assembly.

Turning now to FIG. 2, a cross-sectional view of circuit assembly 10 is illustrated. As shown, printed circuit board 20 is specifically designed to support CPU 30 and includes all supporting circuitry (not shown). Coupled to circuit board 20 is double-sided cold plate 90 which is supported by connecting posts 92. Connecting posts 92 more specifically, are coupled to a bolster 94 attached to or positioned on an opposite side of circuit board 20.

As previously mentioned, a riser card 60 is electrically coupled to printed circuit board 20 using connector 62. As also better illustrated in FIG. 2, a NIC connector 64 is also utilized to provide the connection to riser card 60.

Again, circuit assembly 10 includes a NIC board 50 which is configured to support the network interface chip 54 on one side thereof thus forming NIC board assembly 52. As will be appreciated, NIC board 50 provides all communication capabilities for NIC 54. Additionally, supporting circuitry may also be mounted to NIC board 50, such as cash memory, power, timing circuits, etc. As further illustrated in FIG. 2, NIC 54 is positioned on a "bottom" side of NIC board 50. This is intentionally configured in this manner, so that NIC 54 can be in physical contact with a top side of cold plate 90. In this manner, cold plate 90 can provide dual cooling operations, thus cooling both CPU 30 and NIC 54. To provide physical support, NIC board 50 is physically coupled to cold plate 90 via a set of connection screws 58 and related spacers 59. Consequently, NIC 54, and other components of NIC assembly 52, can be held in physical contact with cooling plate 90, thus maximizing the thermal transmission of energy.

In an alternative embodiment, a heat spreader is positioned between cold plate 90 and NIC assembly 52 thermally coupling multiple components. More specifically, the heat spreader can be configured to thermally couple cold plate 90 with multiple heat producing components supported by NIC assembly 52. Naturally, this would include thermal coupling of NIC 54 and cold plate 90.

Figure 3:
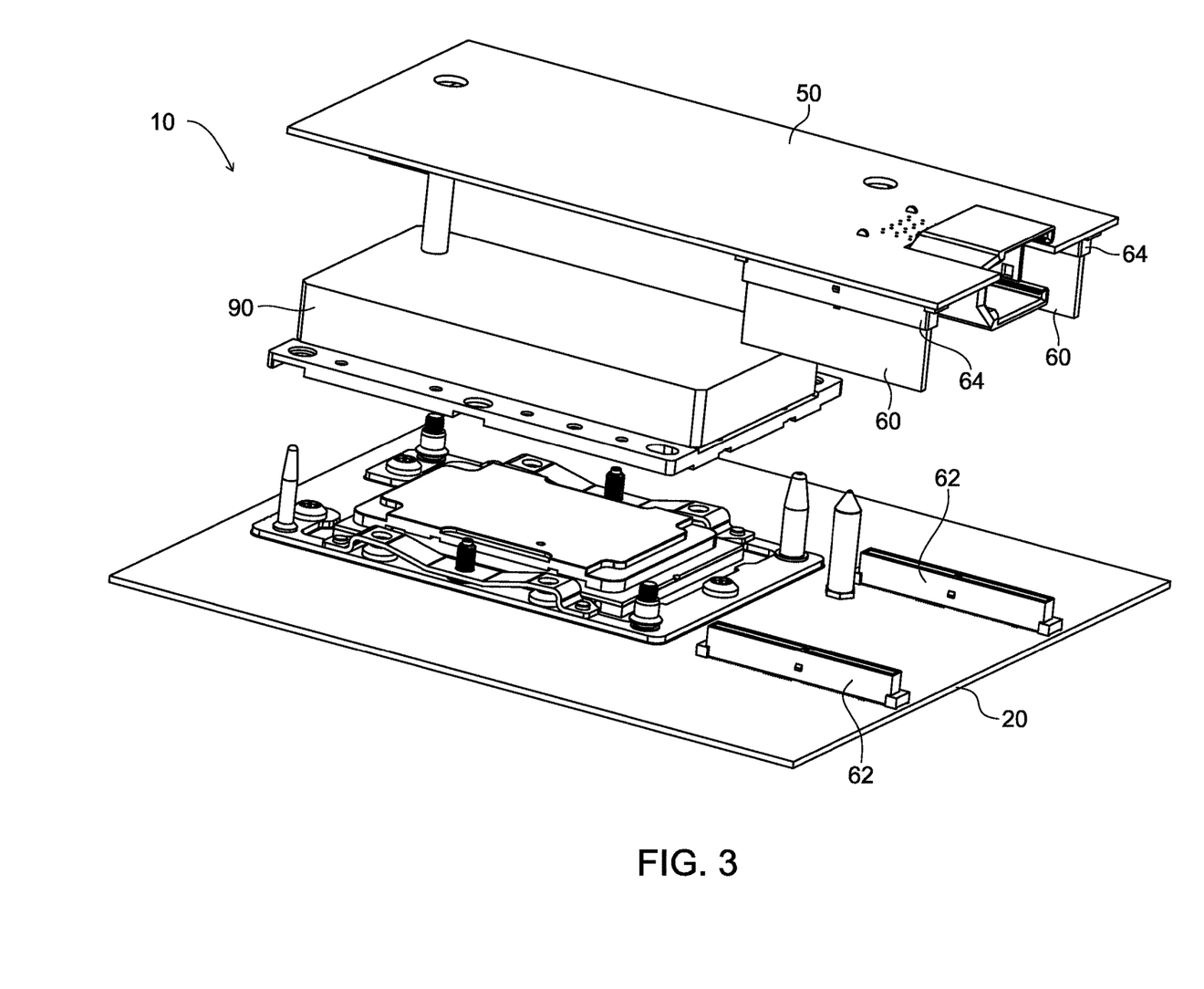
FIG. 3 is an exploded view of the circuit assembly.

To provide further context, FIG. 3 illustrates an exploded view of the components discussed above. Although not specifically illustrated, it will be understood that specific portions of cold plate 90 could also be thermally insulating, thus also allowing for tailored cooling of processor 30 and interface chip 54. Further, a cold plate cap (not shown) may not be necessary as a separate component, and any capabilities provided could be designed into cold plate 90 itself. As will be appreciated, several alternatives are possible for the physical layout and configuration of each component, provided, however, that cooling operations and communication considerations are maintained. Additionally, components could be combined or modified to achieve the desired thermal characteristics. In addition to controlling how fluid travels within cold plate 90, there may also be internal structures that effect thermal characteristics. Cold plate 90 could be configured with internal fins, similar to that of an air cooled heatsink. These fins (normally created via a skiving process) can be attached (formed from) the CPU interface side or the network interface side, or both. If desired the fins could be formed asymmetrically based on cooling capacity required. Both height and spacing could be varied to tune to the exact thermal characteristics required.

In addition to the structures outlined above, a cold plate cap which is simply a thermal coupling component could also be used (not shown). This could provide the ability to tailor thermal characteristics, as a cold plate cap could be thermally insulating or thermally conductive. In one particular embodiment, a cold plate cap is thermally conductive, and helps to provide cooling for interface chip 54.

As generally illustrated in FIGS. 2 and 3, riser card 60 provides a very short communication path between CPU assembly 32 and NIC assembly 52. This is particularly advantageous when dealing with high speed signals.

Figure 4A:
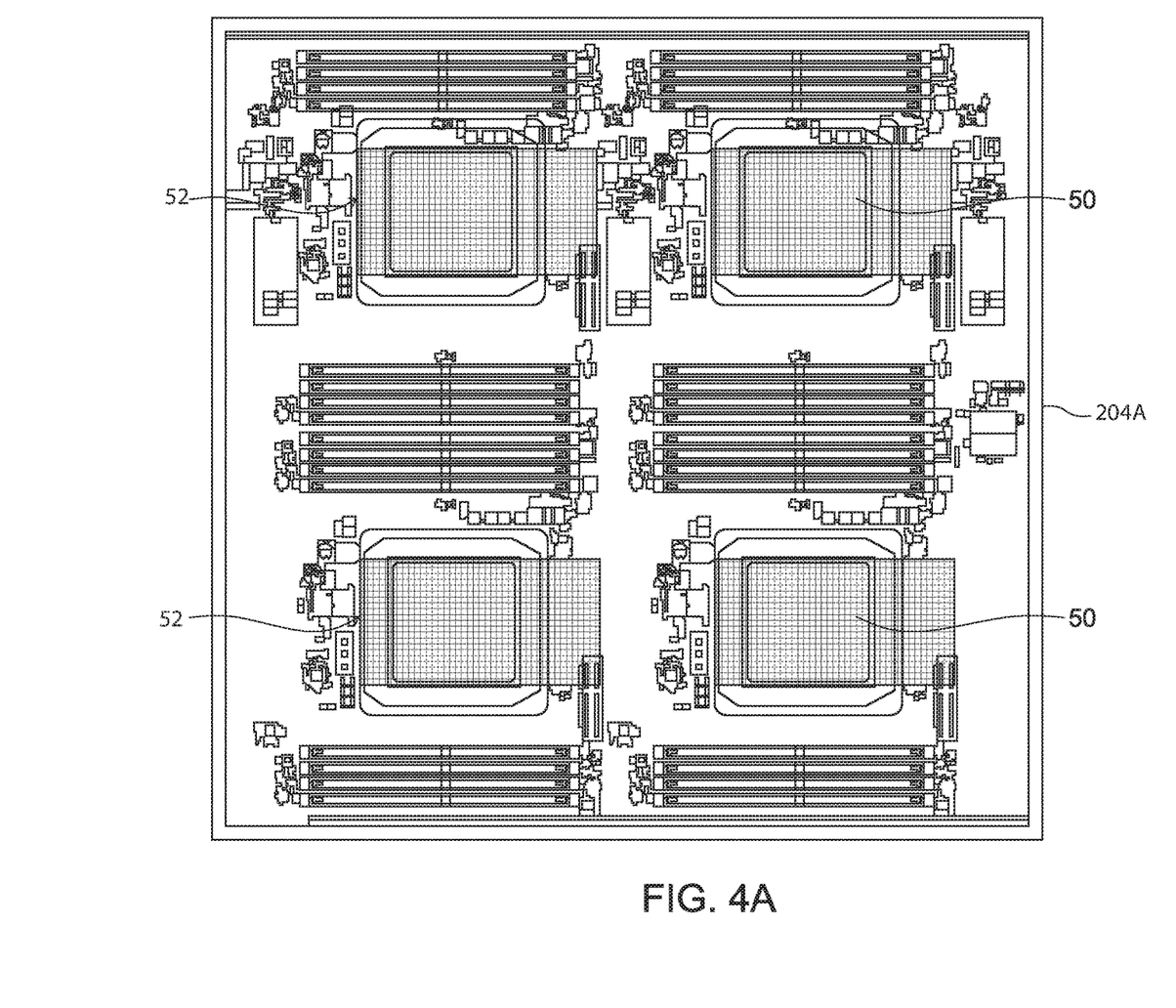
FIGS. 4A and 4B illustrate a top view of two exemplary circuit assembly layouts.
Figure 4B:
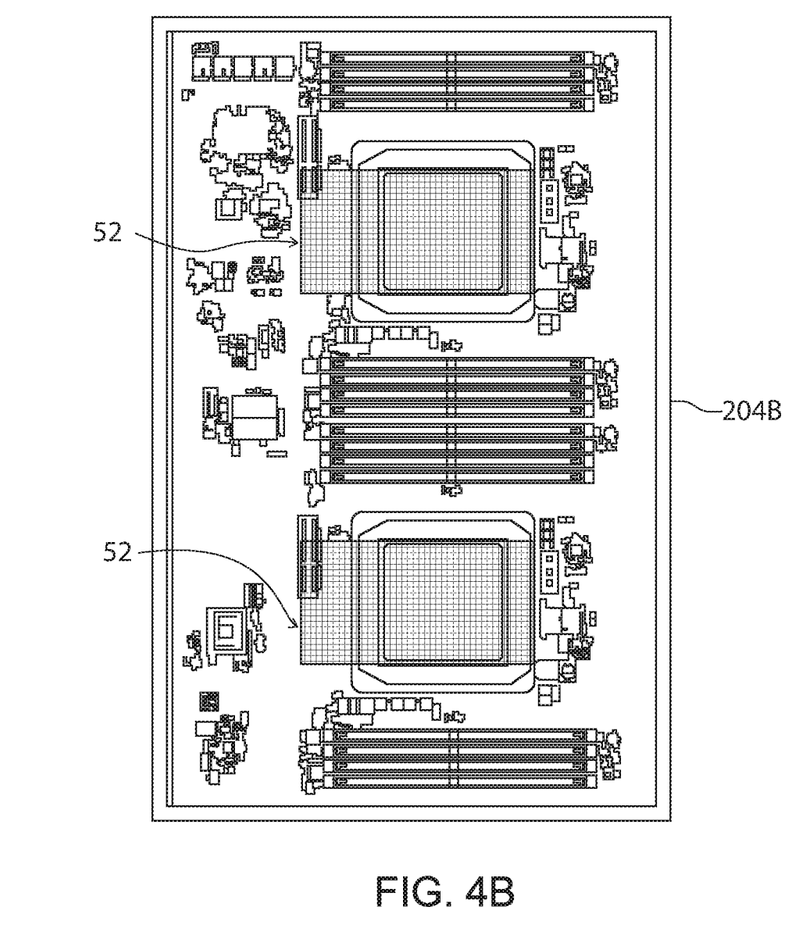
Figure 5A:
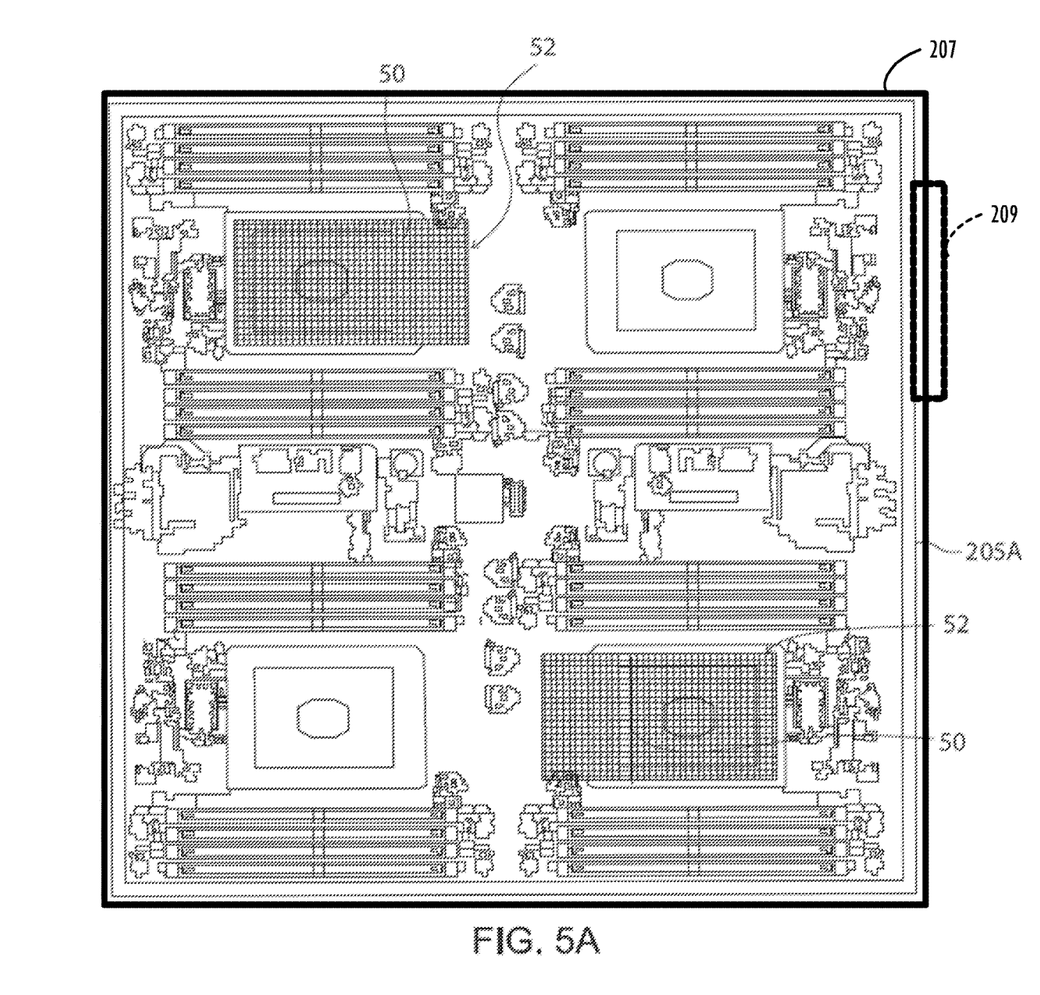
FIGS. 5A and 5B are top views of two alternative exemplary embodiments of the circuit assembly layouts.
Figure 5B:
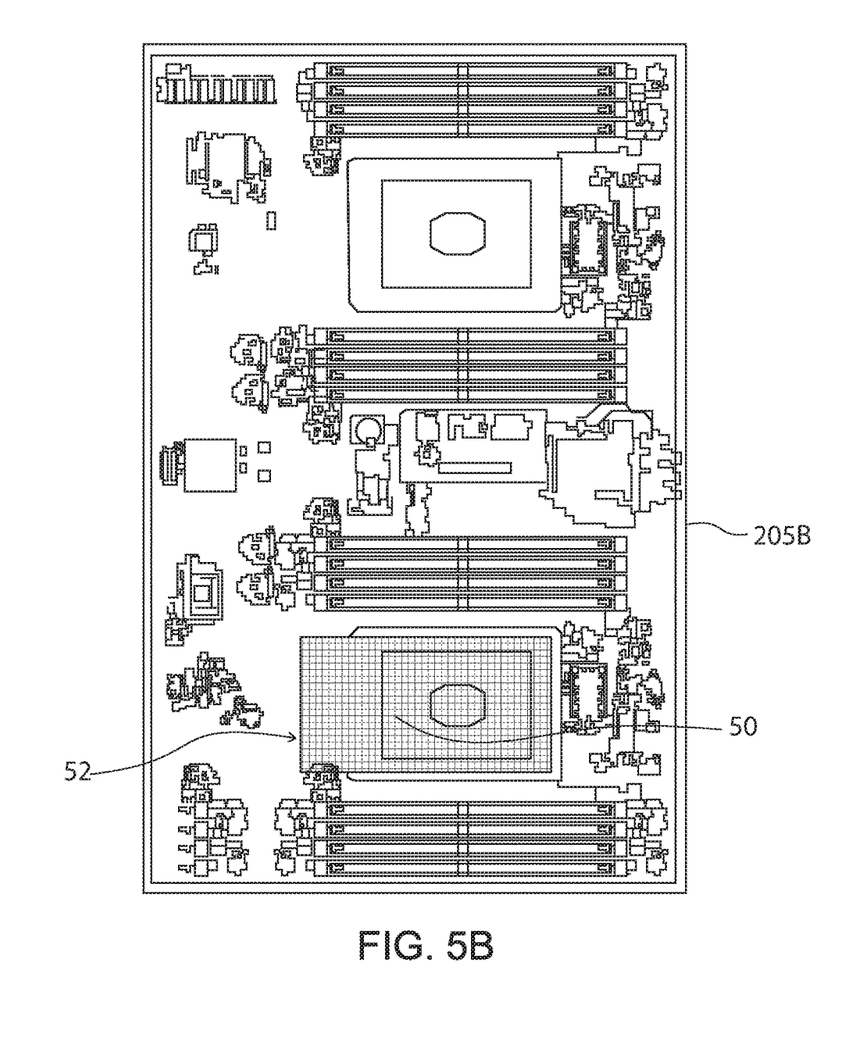

Turning now to FIGS. 4A, 4B, 5A and 5B, a top level layout of various alternative circuit board assemblies are generally illustrated. As will be appreciated, FIGS. 4A and 4B include circuit board assemblies 204A and 204B, each having a NIC board assembly 52 (shown in cross-hatched format for clarity) covering each processor 30. Alternatively, circuit board assemblies 205A and 205B shown in FIGS. 5A and 5B provide an alternative embodiment where one NIC board assembly 52 is utilized for each pair of processors. As will be appreciated by those skilled in the art, NIC board assembly 52 can support communication operations for multiple processors, however, it is contemplated in the embodiments described herein that a signal NIC will be assigned to a minimal number of processors, thus providing more efficient and effective communication capabilities.

In high performance computing applications, several processors are used to perform computing tasks. In many cases, a processor or small group of processors, along with supporting electronics are referred to as nodes. In the embodiments illustrated in FIGS. 4A and 4B, each pair of processors/interface chips is referred to as a node (i.e. each node has two processors and two interface chips). Alternatively, in the embodiment illustrated in FIGS. 5A and 5B, each pair of processors and the related interface chip is considered to be a node (i.e. each node has two processors and one interface chip). This grouping allows for more efficient network communication, and administration of tasks. Naturally, several alternatives are possible.

Again, blades are common structures used to house groupings of computing resources, and to physically manage components since they provide a physical enclosure (e.g., as illustrated by housing 207 of FIG. 5A) and desired connections to electrical and thermal resources (e.g., as illustrated at connection area 209 of FIG. 5A to provide connection points on or through housing 207 enclosure). In the various embodiments outlined herein, it is understood that a single blade could include any collection of components. That said, physical limitations are significant, since each blade housing (i.e. enclosure housing 207) has only a limited amount of space, physical constraints often control the capacity of each blade. In the embodiments contemplated herein, a blade could include a predetermined number of nodes. As several example embodiments, a blade could simply contain the circuit board assembly 204A as illustrated in FIG. 4A, or the circuit board assembly 205A as illustrated in FIG. 5A. Alternatively, each blade could house a combination of circuit board assembly 204A and circuit board assembly 204B, or a combination of circuit board assembly 205A and circuit board assembly 205B. In this alternative, each blade would contain three nodes.

Generally illustrated above, the physical coupling of related components (i.e., PCBA 22, NIC board assembly 52, cold plate 90, and riser card 60) are all supported by various alignment pins and connectors. In most cases, the connectors are screws or bolts of different types. As will be appreciated, these mechanisms can be easily varied or altered to address multiple concerns or considerations. More significantly, these concerns/considerations will involve the efficiency of thermal transfer mechanisms, any physical stresses placed electronic components caused by the connectors themselves, or any alternative considerations related to cooling and/or communication.

As discussed, cold plate 90 is sandwiched between both the NIC board assembly 52 and printed circuit board assembly 22 to provide dual cooling operations. More specifically, cold plate 90 is configured to be thermally coupled with NIC 54 and CPU 30 along with related components supported by PCB 20 and NIC board 50. There are also various alternatives to achieve this result. For example, various heat spreaders could be used to facilitate heat transfer and thermal coupling. Those skilled in the art will also recognize that cold plate 90 can take on many different configurations. Along these lines, it is contemplated that cold plate 90 will include multiple channels and/or communication paths which accommodate the flow of cooling fluid. That said, it is appreciated that these cooling paths or structures can be very specifically tailored to meet several needs. These needs are further described below in relation to various embodiments of cold plate 90.

Referring again to FIGS. 2 and 3, circuit assembly 10 includes a number of connectors and alignment pins. As will be recognized, there are multiple tradeoffs when deciding how to achieve necessary connection. In some cases, very secure coupling of components is helpful, while other circumstances may suggest that some ability to "float" or move within a defined space is beneficial. Further, when thermal efficiency (i.e. effectiveness of cold plate 90) is considered, an alternative connection methodology may be most effective.

As illustrated in FIG. 2, connectors 58 directly connect NIC board assembly 52 to cold plate 90. This will insure that NIC 54 is held in close contact with cold plate 90, and thus is most efficiently cooled. Further, connecting posts 92 are used to couple cold plate 90 and circuit board 20. As best shown in FIG. 3, a spring mechanism 96 is used to retain and hold cold plate 90 in a desired position relative to circuit board 20. Additionally, multiple alignment pins 93 could also be used to maintain alignment of components. This provides one approach to the connection of all components in circuit assembly 10.

As an alternative, circuit board 20 could be rigidly attached cold plate 90, while NIC board 50 is allowed to simply rest upon an upper surface of cold plate 90. Alignment posts again could be used to maintain desired relationships between components. It should be understood that the use of connectors and alignment pins provides a tradeoff— clearly these components make use of space on the circuit board 20, thus it is beneficial to use only a minimum number of connection/alignment components.

Although cold plate 90 is generally illustrated and discussed above, it will be understood that the cold plate 90 can be uniquely configured to achieve a predetermined cooling profile. For example, it may be desirable to have an internal structure within the cooling plate 90 which directs a majority of the cooling fluid to a CPU side, while a minority of the cooling fluid is directed toward the NIC side. This approach is based upon a situation where the CPU requires more cooling capacity (since it typically produces more heat than the NIC). Alternatively, specific areas of cooling plate 90 could have additional fluid flow structures, thus providing focused cooling of specific areas. One example would include a fluid manifold type structure where many fluid pathways are situated directly adjacent the CPU side of cold plate 90, where the area adjacent the NIC has pathways situated a larger distance apart. Those skilled in the art will recognize that the configuration of fluid channels can be easily adapted to meet many needs.

In addition to the considerations outlined above, the compression of components with respect to one another should be considered. Pressure and compression obviously creates stress on components which could be detrimental. Further, the compression may change the thermal transfer characteristics. Although not specifically mentioned above, the use of thermal transfer materials (e.g. thermal gels, etc.) could further affect the overall design of circuit assembly 10.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

The invention claimed is:

1. A compute assembly providing efficient use of board space, efficient network communication, and cooling, the compute assembly comprising:
   a processor board having at least a first processor and a second processor mounted thereon and containing a plurality of supporting electronics;
   a network interface board having a network interface chip configured to provide network communication to and from the first processor and the second processor;
   a riser card coupling the processor board and the network interface board and accommodating communication between the at least first processor and the second processor and the network interface chip, wherein the riser card, the processor board, and the network interface board are configured so communication paths between the first processor and the network interface chip are less than a predetermined distance;
   a first cooling plate positioned between the first processor and the network interface chip, the first cooling plate having an internal cooling fluid path configured to receive a flow of cooling fluid, wherein the network interface chip is in physical contact with the first cooling plate and in thermal communication therewith, and wherein the first cooling plate is in physical contact with the first processor to provide cooling capabilities thereto;
   a second cooling plate positioned in physical contact with the second processor and in thermal communication therewith; and
   at least one alignment pin cooperating with the first cooling plate, the network interface board, and the processor board to provide appropriate alignment for the compute assembly and predetermined spacing there between.

2. The compute assembly of claim 1 wherein the network interface chip is positioned on a bottom side of the network interface board and is in thermal contact with the first cooling plate, and wherein the first processor is positioned on an upper side of the processor board and is also in thermal contact with the first cooling plate.

3. The compute assembly of claim 1 wherein the processor board is configured to contain all computing capabilities for the compute assembly and the network interface board is configured to coordinate communication from the compute assembly to a connected network.

4. The compute assembly of claim 1 wherein all components are contained within a blade housing having physical, electrical, and thermal connecting mechanisms to allow the compute assembly to be used within an ultra-dense high speed computing system.

5. The compute assembly of claim 4 further comprising cabling allowing the network interface board to be connected to one of the electrical connecting mechanisms.

6. The compute assembly of claim 1 wherein the first cooling plate is configured such that a thermal cooling capacity provided to the first processor is different than a cooling capacity provided to the network interface chip.

7. The compute assembly of claim 1 wherein the at least one alignment pin is connected to the processor board and cooperates with the first cooling plate and the network interface board to maintain appropriate alignment.

8. The compute assembly of claim 7 wherein the network interface board is connected to the the first cooling plate, thereby maintaining a predetermined level of contact between the network interface chip and the first cooling plate.

9. The compute assembly of claim 8 further comprising a thermal transfer material positioned between the network interface chip and the the first cooling plate.

10. The compute assembly of claim 1 further comprising a connector attached to the network interface board and the processor board configured to provide the predetermined spacing and to maintain the alignment of the riser card, wherein the connector configuration further causes the first cooling plate to be contained between the network interface board and the processor board.

11. The compute assembly of claim 10 wherein the configuration of the connector causes the processor board and the network interface board to exert a predetermined force on the first cooling plate.

12. The compute assembly of claim 1 configured for use as a first node in a computing system which is made up of a plurality of nodes, wherein the processor board supports the first processor and the second processor, and each of the plurality of nodes comprises the first processor, the second processor, and the network interface chip.

13. The compute assembly of claim 12 wherein the first node is contained within a blade housing having physical, electrical, and thermal connecting mechanisms to allow the compute assembly to be used within an ultra-dense high speed computing system.

14. The compute system of claim 13 wherein the blade housing is configured to contain at least two nodes.

15. A compute blade for use in a computing system, the compute blade comprising:
   an enclosed housing having a predetermined volume including a predetermined height, the housing further having a plurality of electrical connectors and thermal connectors on an exterior surface thereof;
   a processor board supporting a first processor and a second processor contained within the housing;
   an interface board supporting at least one interface chip contained within the housing, the interface board in communication with the first processor, the second processor, and at least one of the plurality of electrical connectors;
   a riser card providing a communication path between the processor board and the interface board, the riser card also contained within the housing;
   a first cooling plate positioned between the processor board and the interface board, with a first surface positioned adjacent the processor board and in thermal contact with the first processor and a second surface adjacent the interface board and in thermal contact with the interface chip, the first cooling plate having an internal cooling fluid path supporting a flow of cooling fluid and configured to receive cooling fluid via a fluid transmission path from the thermal connectors;
   a second cooling plate positioned adjacent the processor board and in thermal contact with the second processor, the second cooling plate having an internal cooling fluid path supporting a flow of cooling fluid and configured to receive cooling fluid via the fluid transmission path; and
   an alignment pin cooperating with the first cooling plate, the second cooling plate, the interface board, and the processor board to provide appropriate alignment for the compute blade and predetermined spacing there between;
   wherein the combined height of the processor board, the first cooling plate, the second cooling plate and the interface board board is less than the predetermined height of the housing.

16. The compute blade of claim 15 further comprising a connector coupling the interface board to the first cooling plate, thereby maintaining the interface chip and the first cooling plate in thermal contact with one another.

17. The compute blade of claim 16 wherein the processor board is coupled to a portion of the housing, and is further coupled to the first cooling plate, and wherein the alignment pin is attached to the processor board and is allowed to pass through alignment openings in the first cooling plate and the interface board.

18. The compute blade of claim 15 further comprising a connector attaching the processor board to the interface board, the connector further providing a holding force causing the riser card to be held in place, and configured to cause compressive forces on the first cooling plate by both the processor board and the interface board, thereby holding the first cooling plate in a desired position.

19. The compute blade of claim 15 wherein the first cooling plate is configured such that a thermal cooling capacity provided to the processor board is different than a cooling capacity provided to the interface board.

20. A compute blade for use in a computing system having a plurality of nodes, comprising:
   an enclosed housing having a predetermined volume including a predetermined height, the housing further having a plurality of electrical connectors and thermal connectors on an exterior surface thereof;
   a processor board supporting a first processor, a second processor, and a set of supporting electronics mounted within the housing;
   an interface board supporting at least one interface chip contained within the housing, the interface board in communication with at least one of the plurality of electrical connectors to provide communication to the computing system, wherein the first processor, the second processor, the set of supporting electronics, and the interface chip make up a node of the plurality of nodes;
   a riser card removably attached to the interface board and the processor board, and, providing a communication path from both the first processor and the second processor to the interface board, the riser card also contained within the housing;
   a first cold plate positioned between the processor board and the interface board, with a first surface positioned adjacent the processor board and in thermal contact with the first processor and a second surface adjacent the interface board and in thermal contact with the interface chip, the first cold plate having an internal cooling structure supporting a flow of cooling fluid and configured to receive cooling fluid via a fluid transmission path from the thermal connectors;
   the second processor; and
   a second cold plate positioned in thermal contact with the second processor;
   wherein the combined height of the processor board, the first cold plate, the second cold plate, and the interface board is less than the predetermined height of the housing.

21. The compute blade of claim 20, wherein the housing contains three nodes of the plurality of nodes.

22. The compute blade of claim 20 further comprising a connector to provide a direct connection between the interface board and the first cold plate, thereby maintaining thermal contact therebetween.

23. The compute blade of claim 20 further comprising a connector to provide a direct connection between the interface board and the processor board, the connector further providing a holding force causing the riser card to be held in place, and configured to cause compressive forces on the first cold plate by both the processor board and the interface board, thereby holding the first cold plate in a desired position.

* * * * *